United States Patent [19]

Parker et al.

[11] Patent Number: 5,057,487
[45] Date of Patent: Oct. 15, 1991

[54] CRYSTAL GROWTH METHOD FOR Y-BA-CU-O COMPOUNDS

[75] Inventors: Sidney G. Parker; Sam R. Walker, both of Dallas, Tex.

[73] Assignee: Texas Instruments Incorporated, Dallas, Tex.

[21] Appl. No.: 114,885

[22] Filed: Oct. 29, 1987

[51] Int. Cl.$^5$ .................... C30B 15/34; B01J 17/18
[52] U.S. Cl. .................... 505/1; 156/621; 156/623 R; 156/617.1; 252/518; 252/521; 505/729
[58] Field of Search .................... 156/619, 621, 623 R, 156/911, 620.73, 608; 252/518, 521; 505/1, 729

[56] References Cited

U.S. PATENT DOCUMENTS

| | | | |
|---|---|---|---|
| 3,660,044 | 5/1972 | Keller | 156/620.73 |
| 3,939,252 | 2/1976 | Pandey | 156/619.1 |
| 4,030,963 | 6/1977 | Gibson et al. | 156/620.73 |
| 4,133,969 | 1/1979 | Zumbrunnen | 156/617.1 |
| 4,213,940 | 7/1980 | Zerbst | 156/608 |
| 4,268,483 | 5/1981 | Davey et al. | 422/246 |
| 4,609,425 | 9/1986 | Mateika et al. | 156/617.1 |
| 4,724,038 | 2/1988 | Pastor et al. | 156/620 |
| 4,731,153 | 3/1988 | Hirano et al. | 252/518 |
| 4,793,894 | 12/1988 | Jacco et al. | 156/621 |
| 4,865,682 | 9/1989 | Okano et al. | 422/249 |

OTHER PUBLICATIONS

Ono et al. Jap. Jour. Appl. Phys. (May 1987) L825.
Schneemeyer et al. Nature, vol. 328 (13 Aug. 1987) 601.
Dinger et al. Phys. Rev. Letts. 58 (22 Jun. 1987) 2687.
Jin et al. Appl. Phys. Letts, 51 (1987) 943.
Cocks et al. J. Appl. Phys. 43 (1972) 3878.
LaBelle et al. Mat. Res. Bull. 6 (1971) 571.
Takekawa et al. Jap. Jour. Appl. Phys. 26 (May 1987) p. L-851-53.
Liu et al. Phys. Letts, 121 (4 May 1987) 305.
Sueno et al. Jap. Jour. Appl. Phys. 26 (5 May 1987), L-842.
Hayashi et al. Jap. Jour. Appl. Phys. (Jul. 1987) L-1197.

Primary Examiner—Upendra Roy

[57] ABSTRACT

Methods of growing Y-Ba-Cu-O compound crystal by suspended pellet partial melting and cooling and by skill melting, with crystal pulling after nucleation on a small platinum wedge or epitaxial growth on an inserted substrate.

12 Claims, 2 Drawing Sheets

CRYSTAL GROWTH METHOD FOR Y-BA-CU-O COMPOUNDS

BACKGROUND OF THE INVENTION

1. Field of the Invention

The present invention relates to crystal growth, and, more particularly, to growth of crystalline ceramic superconductors such as $YBa_2Cu_3O_{7-\delta}$.

2. Description of the Related Art

High critical temperature ceramic superconductors were first announced in late 1986 by Bednorz and Muller, 64 Z.Phys. B 189 (1986) for a La-Ba-Cu-O system and early 1987 by Wu et al, 58 Phys.Rev.Lett 908 (1987) for a Y-Ba-Cu-O system. These discoveries unleased a flood of research on Cu-O based oxygen-deficient perovskite compounds aimed at practical superconducting applications. But the brittleness and instability with respect to processing variables of these compounds has limited use of standard fabrication techniques and led to searches for substitutes. For example, S.Jin et al, 51 Appl.Phys.Lett. 943 (1987) describes a method for drawing molten $YBa_2Cu_3O_{7-\delta}$ into a wire; and M.Damento et al, 51 Appl.Phys.Lett 690 (1987) describes a method of crystal growth for $YBa_2Cu_3O_{7-\delta}$ using an excess of CuO.

However, the known crystal growth methods can only produce relatively small crystals (3 mm by 3 mm by 0.2 mm) of $YBa_2Cu_3O_{7-\delta}$ type compounds, and these crystals are usually embedded in the solidified melt from which they are grown and are difficult to remove. See for example, D.Kaiser et al, Growth of $YBa_2Cu_3O_z$ Single Crystals, 51 Appl.Phys.Lett. 1040 (1987). Further, the melt reacts with all crucible materials used, and this reaction (or wetting) dopes the melt and any crystals grown from it. See for example, M.Gurvitch et al, Preparation and Substrate Reactions of Superconducting Y-Ba-Cu-O Films, 51 Appl.Phys.Lett. 1027 (1987).

SUMMARY OF THE INVENTION

The present invention provides for growth of large crystals of $YBa_2Cu_3O_{7-\delta}$ type compounds in containerless or self-contained melts which also improves purity over known methods. Preferred embodiments include pressing ingredients such as $Y_2O_3$, $BaCO_3$, and CuO into a pellet and supporting the pellet in only limited regions during melting and crystal growth. Further preferred embodiments include use of skull melting in a crucible with both inductive heating and crucible cooling.

BRIEF DESCRIPTION OF THE DRAWINGS

The drawings are schematic for clarity.

DESCRIPTION OF THE PREFERRED EMBODIMENTS

A first preferred embodiment crystallization method for $YBa_2Cu_3O_{7-\delta}$ includes the following steps:

(a) Mix 0.5–1.5 moles of powdered yttrium oxide ($Y_2O_3$), 2–12 moles of powdered barium carbonate ($BaCO_3$), and 3–20 moles of powdered cupric oxide (CuO), or fractions of the same, each of the ingredients of reagent grade or greater purity, in a ball mill as a water slurry to obtain particles of size less than or equal to 325 mesh. Dry the slurry in an oven; then regrind the mixture with a mortar and pestle. Press the reground mixture into circular pellets 12 (FIG. 1) of size about 25 mm diameter by 5–10 mm thickness at a pressure of 5,000 psig at room temperature in a hydraulic press with a stainless steel die.

Figure 1:
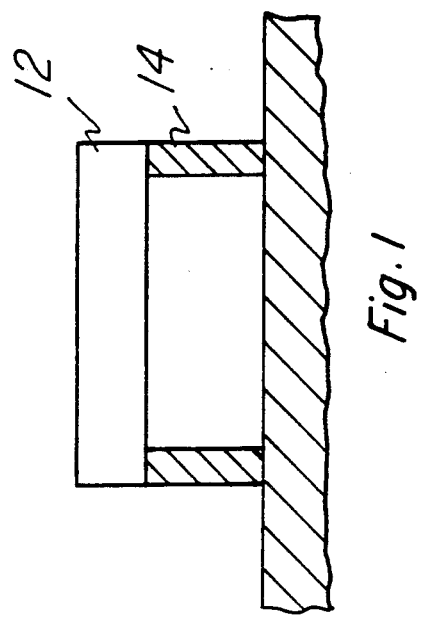
FIG. 1 is a cross sectional elevation view illustrating a first preferred embodiment method.

(b) Place pellet 12 across the end of short section of 25 mm diameter alumina cylinder 14, as illustrated in cross setional elevation view in FIG. 1, and place cylinder 14 plus pellet 12 in air in a 900° C. furnace. Sinter for 8–16 hours and cool at 1° C. per minute to 500° C.; then cool in the furnace by shutting off the power. Grind the sintered pellets 12 with a mortar and pestle and repress the mixture into pellets 12'. Repeat the sintering-cooling operation with pellet 12' supported on cylinder 14 at least once to form the compound $YBa_2Cu_3O_{7-\delta}$.

(c) Raise the temperature in the furnace to 1,000°–1,100° C.; the ambient in the furnace may be air at atmospheric pressure. At these temperatures pellet 12' partially melts (a eutectic or peritectic composition melts) and wets cylinder 14 but retains its shape except for sagging. After 2–4 hours at 1,000°–1,100° C., the temperature is lowered to room temperature at a rate of 1° C. per minute. Single crystals of $YBa_2Cu_3O_{7-\delta}$ nucleate in pellet 12' at the contact with alumina cylinder 14 and grow. The crystals are separated from the remainder of the pellet by sawing or cleaving.

The oxygen content of the crystals may need to be adjusted to achieve superconductivity at high temperatures; thus the following step may be included:

(d) Flow a mixture of pure oxygen through the furnace at atmospheric pressure and raise the furnace temperature to 900° C. for 6 hours. This permits the oxygen content to reach an equilibrium at a stoichiometric deficiency of $\delta \leq 0.2$; that is, $YBa_2Cu_3O_{6.8-7}$. Cool at 1° C. per minute to 500° C.; then cool in the furnace by shutting off the power.

Figure 2:
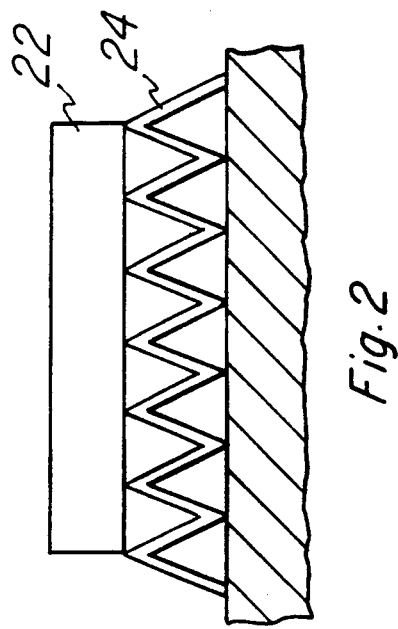
FIG. 2 is a cross sectional elevation view illustrating a second preferred embodiment method.

A second preferred embodiment method of crystallization for $YBa_2Cu_3O_{7-\delta}$ includes the following steps:

(a) Same as step (a) of the first preferred embodiment to form pellets 22 (FIG. 2).

(b) Same as step (b) of the first preferred embodiment but with pellet 22 placed across corrugated platinum sheet 24, as illustrated in cross sectional elevation view in FIG. 2, and sheet 24 plus pellet 22 are inserted into a furnace with an open top.

Figure 3:
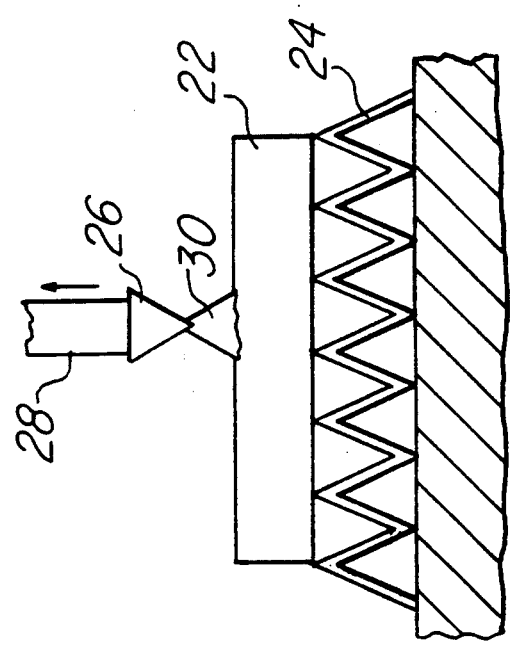
FIG. 3 is a cross sectional elevation view illustrating a further feature of the second preferred embodiment method.

(c) As in step (c) of the first preferred embodiment method, raise the temperature in the furnace to 1,000°–1,100° C.; the ambient in the furnace again may be air at atmospheric pressure. After 2-3 hours at 1,000°–1,100° C., pellet 22 is somewhat homogeneous and partially molten; and platinum wedge 26 (FIG. 3) of size about 10 mm long and with a 60° wedge angle is then pressed about 2 mm into the top of pellet 22 and cooled through support 28. $YBa_2Cu_3O_{7-\delta}$ crystals nucleate on wedge 26, and wedge 26 is pulled out of pellet 22 at 1 mm/hour; as wedge 26 is pulled crystal 30 of YBa$_2$-

$Cu_3O_{7-\delta}$ grows in size and eventually constitutes 10–20% of the material making up pellet 22. The temperature of the furnace is vertically graded to avoid melting the pulled crystal; see FIG. 3. After pulling, the crystal of $YBa_2Cu_3O_{7-\delta}$ is separated from wedge 26, and the oxygen content may be adjusted as in step (d) following the first preferred embodiment.

A third preferred embodiment method of crystallization includes the following steps:

(a) Same as step (a) of the first preferred embodiment method.

(b) Same as step (b) of the first preferred embodiment method; but after two sintering-cooling cycles the pellet is ground to a powder.

Figure 4:
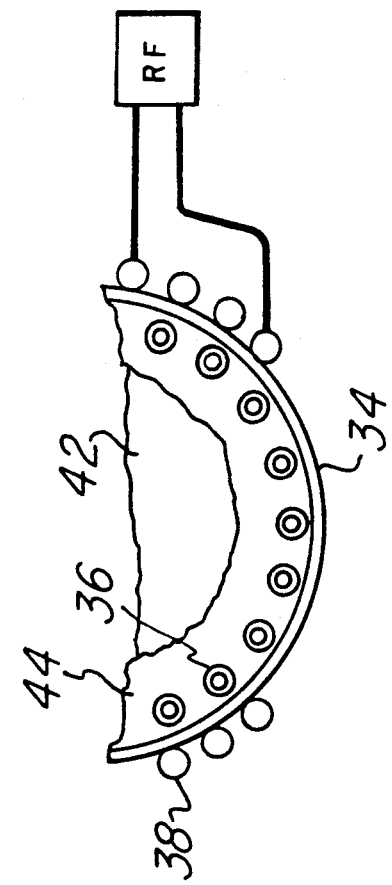
FIG. 4 is a cross sectional elevation view illustrating a third preferred embodiment method.

(c) Put the powder in hemispherical gold crucible 34 (FIG. 4) with interior cooling coils 36 and exterior rf induction heating coils 38 for skull melting. The heating coils are driven at 13.56 MHz and heat the powder to 1,000°–1,100° C. in the center of crucible 34 to melt the powder, but cooling coils 36 keep the temperature of the boundary portion of the powder adjacent crucible 34 below 900° C. and prevent melting. Thus molten portion 42 is separated from crucible 34 by cooled portion 44 which thus contains the molten portion 42 without introducing any impurities. As in the second preferred embodiment, a platinum wedge may be used to pull a crystal of $YBa_2Cu_3O_{7-\delta}$ from molten portion 42. Alternatively, a single crystal substrate of a material such as $SrTiO_3$, $Al_2O_3$ (sapphire), $ZrO_2 + Y_2O_3$ (ytterium stablizied cubic zirconia), or MgO attached to a heat sink can be inserted into molten portion 42 and a epitaxial film of $YBa_2Cu_3O_{7-\delta}$ grown on the substrate.

Note that the sintering of steps (a) and (b) could be omitted in the skull melting of the third preferred embodiment method; no supportable pellet is used.

MODIFICATIONS AND ADVANTAGES

Various modifications of the preferred embodiment devices and methods may be made while retaining the features of partial melting with avoidance of impurity sources. For example, the dimensions and shapes of the pellets may be greatly varied, the wedges used for crystal pulling could have various end geometries, the support and crucible materials may be other convenient materials, the supporst may have other geometries providing small contact areas, the starting materials may be other compounds containing the Y, Ba, Cu, and O such as powdered metal and hydrated oxides, and the oxygen adjustment anneal may be performed at various temperatures.

The invention provides the advantages of large crystal size with low impurity contamination.

What is claimed is:

1. A crystallization method for Y-Ba-Cu-O compounds, comprising the step of:
   (a) providing a powdered mixture of Y, Ba, Cu and O containing materials of at least reagent grade purity;
   (b) pressing said mixture into a pellet;
   (c) suspending said pellet on a support, said pellet having a relatively minor area thereof in contact with said support;
   (d) raising the temperature of a portion of said pellet to the melting point thereof; and
   (e) cooling said pellet.

2. The method of claim 1, comprising the further step of:
   (a) sintering said pellet prior to said partial melting.

3. The method of claim 1, wherein:
   (a) said pellet is supported on an end of an alumina cylinder.

4. The method of claim 1, wherein:
   (a) said pellet is supported on a corrugated platinum sheet.

5. A crystallization method for Y-Ba-Cu-O compounds, comprising the steps of:
   (a) providing a powdered mixture of Y, Ba, Cu and O containing materials of at least reagent grade purity;
   (b) pressing said mixture into a pellet;
   (c) suspending said pellet on a support, said pellet having a relatively minor area thereof in contact with said support;
   (d) raising the temperature of a portion of said pellet to the melting point thereof;
   (e) inserting a wedge into said partially molten pellet; and
   (f) cooling said pellet.

6. The method of claim 5, comprising the further steps of:
   (a) after said sintering, grinding said pellet into a powder;
   (b) pressing said powder to reform said pellet; and
   (c) sintering said pellet prior to said partial melting.

7. The method of claim 5 wherein said wedge is platinum.

8. The method of claim 5 wherein said wedge is about a 60 degree angle wedge.

9. The method of claim 6, further comprising the steps of:
   (a) inserting a wedge into said partially molten pellet; and
   (b) cooling and withdrawing said wedge to pull crystals of Y-Ba-Cu-O compounds.

10. The method of claim 6, further comprising the steps of:
    (a) inserting a substrate into said partially molten pellet; and
    (b) cooling said substrate to epitaxially grow crystals of Y-Ba-Cu-O compounds on said substrate.

11. The method of claim 7 wherein said wedge is about a 60 degree angle wedge.

12. A crystallization method for Y-Ba-Cu-O compounds, comprising the steps of:
    (a) providing a powdered mixture of Y, Ba, Cu, and O containing materials of at least reagent grade purity in a crucible for skull melting;
    (b) raising the temperature of said mixture to melt a portion of said pellet excluding a boundary layer of said pellet contacting said crucible;
    (c) inserting a wedge into the molten portion of said mixture; and
    (d) cooling and withdrawing said wedge to pull crystals of a Y-Ba-Cu-O compound from said molten portion of said mixture.

* * * * *